(12) United States Patent
Huang et al.

(10) Patent No.: US 9,117,796 B2
(45) Date of Patent: Aug. 25, 2015

(54) SEMICONDUCTOR ARRANGEMENT AND FORMATION THEREOF

(71) Applicant: Taiwan Semiconductor Manufacturing Company Limited, Hsin-Chu (TW)

(72) Inventors: Bo-Jr Huang, Tainan (TW); Nan-Hsin Tseng, Tainan (TW); Ping-Han Tsai, New Taipei (TW); Wei-Hao Kao, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 6 days.

(21) Appl. No.: 14/166,925

(22) Filed: Jan. 29, 2014

(65) Prior Publication Data
US 2015/0214288 A1    Jul. 30, 2015

(51) Int. Cl.
*H01L 21/8242*    (2006.01)
*H01L 49/02*    (2006.01)
*H01L 23/522*    (2006.01)
*H01L 27/02*    (2006.01)
*H01L 27/06*    (2006.01)
*H01L 21/768*    (2006.01)
*H01L 27/08*    (2006.01)

(52) U.S. Cl.
CPC ............... *H01L 28/40* (2013.01); *H01L 21/768* (2013.01); *H01L 23/5226* (2013.01); *H01L 27/0207* (2013.01); *H01L 27/0688* (2013.01); *H01L 27/0805* (2013.01)

(58) Field of Classification Search
None
See application file for complete search history.

(56) References Cited

U.S. PATENT DOCUMENTS

2009/0302364 A1 *   12/2009  Duarte de Martin et al.  . 257/296

* cited by examiner

*Primary Examiner* — Jack Chen
(74) *Attorney, Agent, or Firm* — Cooper Legal Group LLC (57) ABSTRACT

A semiconductor arrangement and methods of forming the same are described. A semiconductor arrangement includes a first tier including a first capacitor, a second tier over the first tier, the second tier including a second capacitor, and a first substrate between the first tier and the second tier. The first capacitor is connected to the second capacitor through the substrate. A plurality of tiers are contemplated, such that a total capacitance of the semiconductor arrangement increases based upon interconnection of metal layers of different tiers. Additionally, the semiconductor arrangement has a greater area efficiency as compared to multiple capacitors in parallel.

20 Claims, 7 Drawing Sheets

SEMICONDUCTOR ARRANGEMENT AND FORMATION THEREOF

BACKGROUND

Capacitors are useful to, among other things, store electrical charge within circuits. Capacitors are devices that have one or more pairs of conductors separated by an insulator. A charge accumulates within a capacitor when a voltage is applied across the pair of conductors.

DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a semiconductor arrangement comprises a first tier comprising a first capacitor, a second tier comprising a second capacitor, the second tier over the first tier, and a first substrate between the first tier and the second tier. According to some embodiments, the semiconductor arrangement comprises a third tier comprising a third capacitor, the third tier over the second tier, and a second substrate between the second tier and the third tier. In some embodiments, the first capacitor is connected to the second capacitor through the first substrate. In some embodiments, the first capacitor comprises a first capacitor bottom metal, a first insulating layer and a first capacitor top metal, the first insulating layer between the first capacitor bottom metal and the first capacitor top metal. In some embodiments, the second capacitor comprises a second capacitor bottom metal, a second insulating layer and a second capacitor top metal, the second insulating layer between the second capacitor bottom metal and the second capacitor top metal. In some embodiments, the third capacitor is connected to the second capacitor through the second substrate. In some embodiments, the third capacitor comprises a third capacitor bottom metal, a third insulating layer and a third capacitor top metal, the third insulating layer between the third capacitor bottom metal and the third capacitor top metal. In some embodiments, the first tier comprises a first bottom metal and a first top metal, such that the first capacitor is over the first bottom metal and the first top metal is over the first capacitor. In some embodiments, the second tier comprises a second bottom metal and a second top metal, such that the second capacitor is over the second bottom metal and the second top metal is over the second capacitor. In some embodiments, the third tier comprises a third bottom metal and a third top metal, such that the third capacitor is over the third bottom metal and the third top metal is over the third capacitor. In some embodiments, the first capacitor is connected to the second capacitor by a first top via connecting the first capacitor top metal to the first top metal, a first interlayer via in the first substrate connecting the first top metal to the second bottom metal, and a second bottom via connecting the second bottom metal to the second capacitor bottom metal. In some embodiments, the second capacitor is connected to the third capacitor by a second top via connecting the second capacitor top metal to the second top metal, a second interlayer via in the second substrate connecting the second top metal to the third bottom metal, and a third bottom via connecting the third bottom metal to the third capacitor bottom metal. In some embodiments, the second capacitor bottom metal and the third capacitor top metal are connected via a power input. In some embodiments, the first capacitor bottom metal and the third capacitor bottom metal are connected via a power output. According to some embodiments, a capacitance of the arrangement, or rather of one or more capacitors therein, is increased based upon the interconnection of metal layers. In some embodiments, a semiconductor arrangement with two or more tiers has a greater area efficiency than a semiconductor arrangement with a single capacitor, or multiple capacitors in parallel. In some embodiments, the increased area efficiency is attributable, at least in part, to the stacked arrangement of the tiers.

Figure 1:
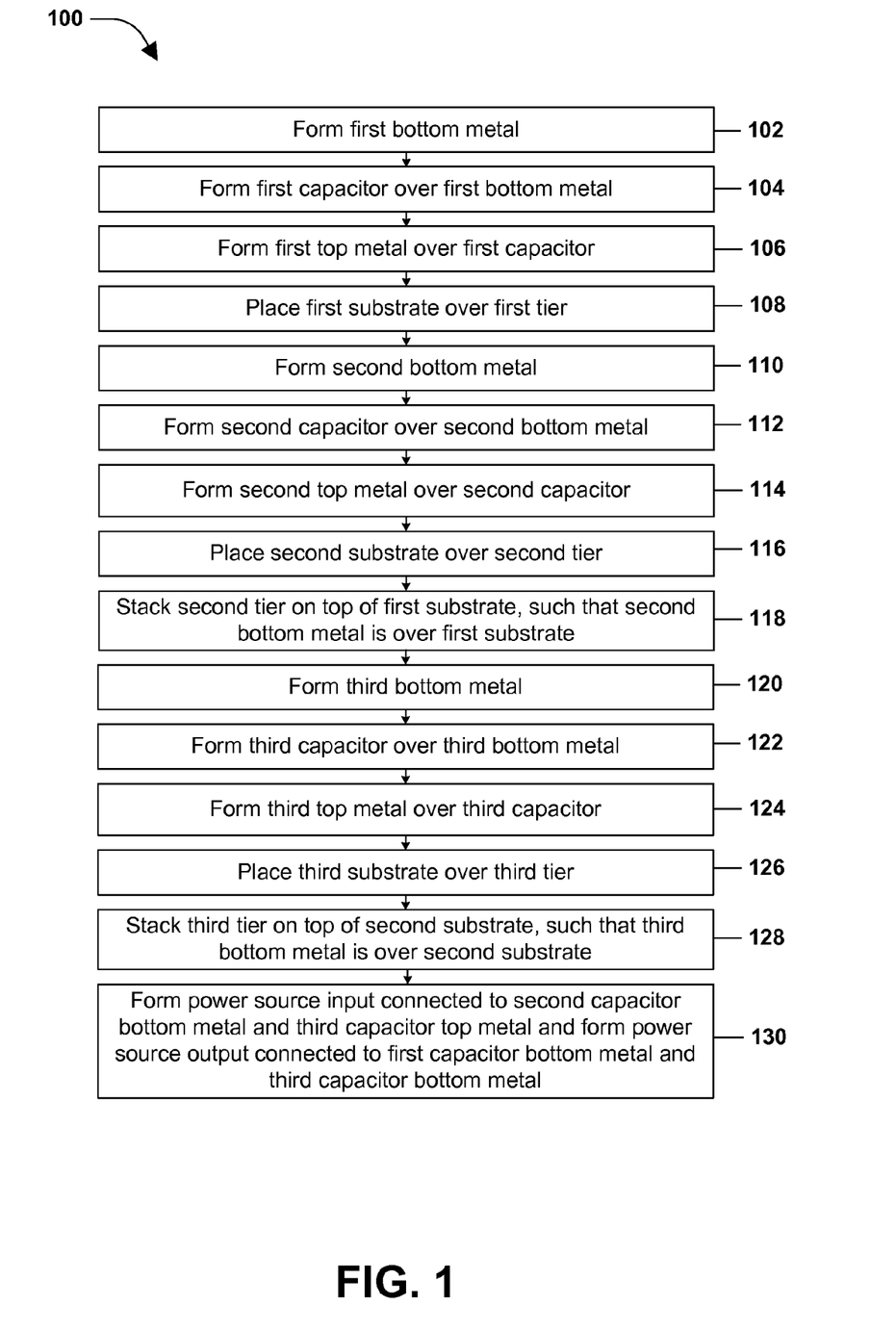
FIG. 1 is a flow diagram illustrating a method of forming a semiconductor arrangement, according to some embodiments.

A method 100 of forming a semiconductor arrangement 200 according to some embodiments is illustrated in FIG. 1 and one or more structures formed thereby at various stages of fabrication are illustrated in FIGS. 2-17. According to some embodiments, such as illustrated in FIG. 17, the semiconductor arrangement 200 comprises a first tier 232 comprising a first capacitor 215, a second tier 332 comprising a second capacitor 315, the second tier 332 over the first tier 232, and a first substrate 226 between the first tier 232 and the second tier 332. In some embodiments, the semiconductor arrangement 200 comprises a third tier 432 comprising a third capacitor 415, the third tier 432 over the second tier 332, and a second substrate 326 between the second tier 332 and the third tier 432. According to some embodiments, the first capacitor 215 is connected to the second capacitor 315 through the first substrate 226. According to some embodiments, the second capacitor 315 is connected to the third capacitor 415 through the second substrate 326. According to some embodiments, a second capacitor bottom metal 312 of the second capacitor 315 is connected to a third capacitor top metal 416 of the third capacitor 415 via a power input 440. According to some embodiments, a first capacitor bottom metal 212 of the first capacitor 215 is connected to a third capacitor bottom metal 412 of the third capacitor 415 via a power output 442.

Figure 2:
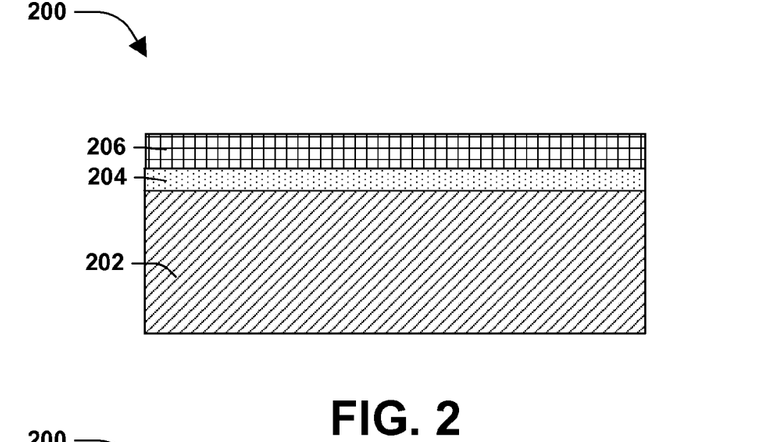
FIG. 2 is an illustration of a semiconductor arrangement at a stage of fabrication, according to some embodiments.
Figure 3:
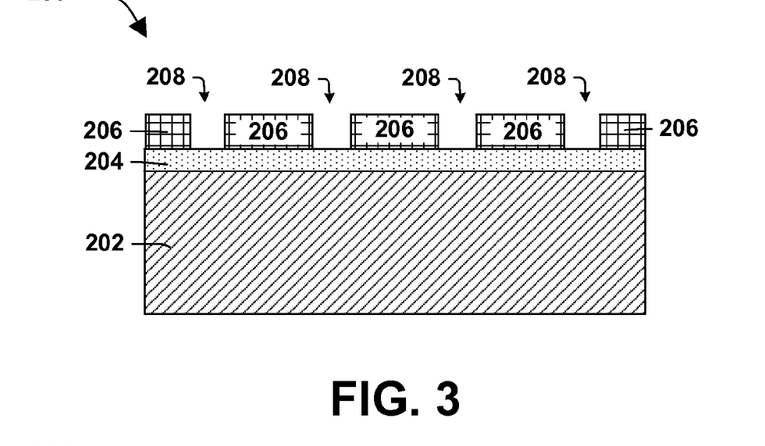
FIG. 3 is an illustration of a semiconductor arrangement at a stage of fabrication, according to some embodiments.
Figure 4:
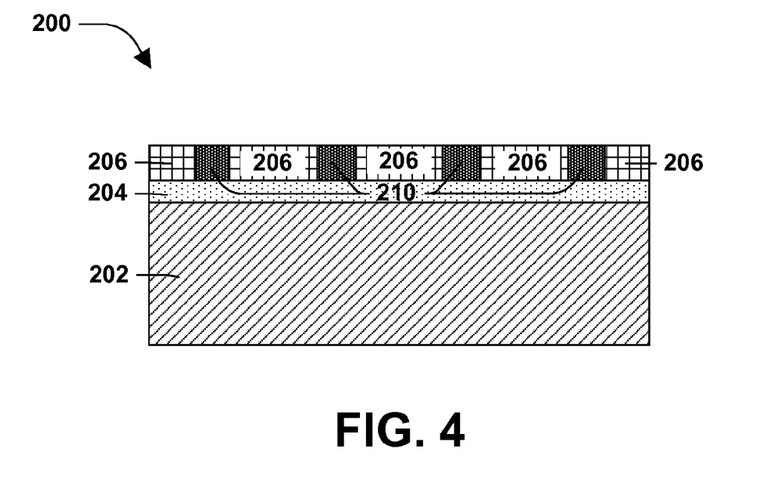
FIG. 4 is an illustration of a semiconductor arrangement at a stage of fabrication, according to some embodiments.
Figure 5:
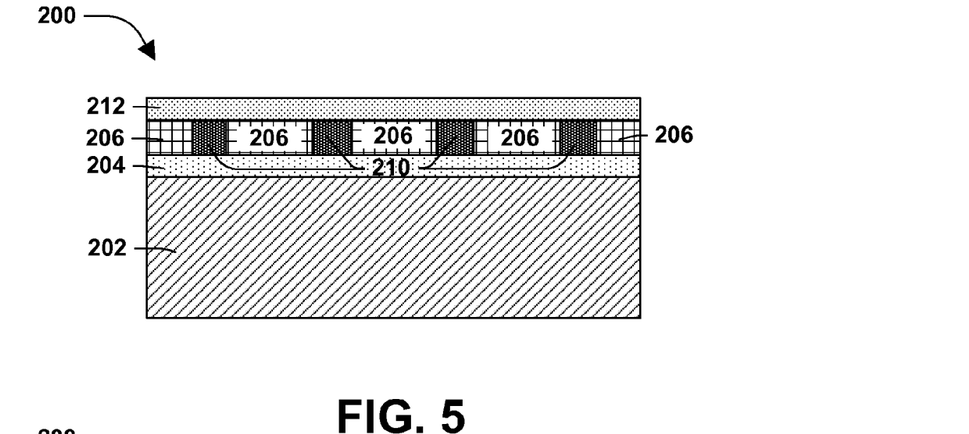
FIG. 5 is an illustration of a semiconductor arrangement at a stage of fabrication, according to some embodiments.
Figure 6:
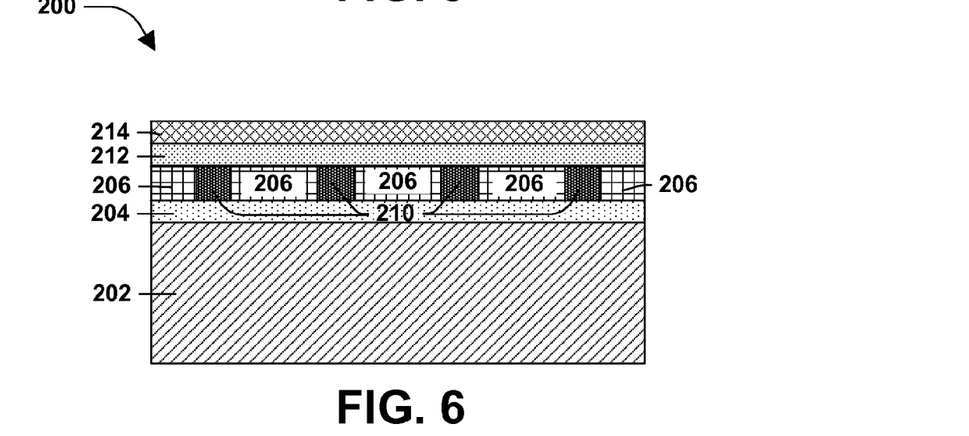
FIG. 6 is an illustration of a semiconductor arrangement at a stage of fabrication, according to some embodiments.
Figure 7:
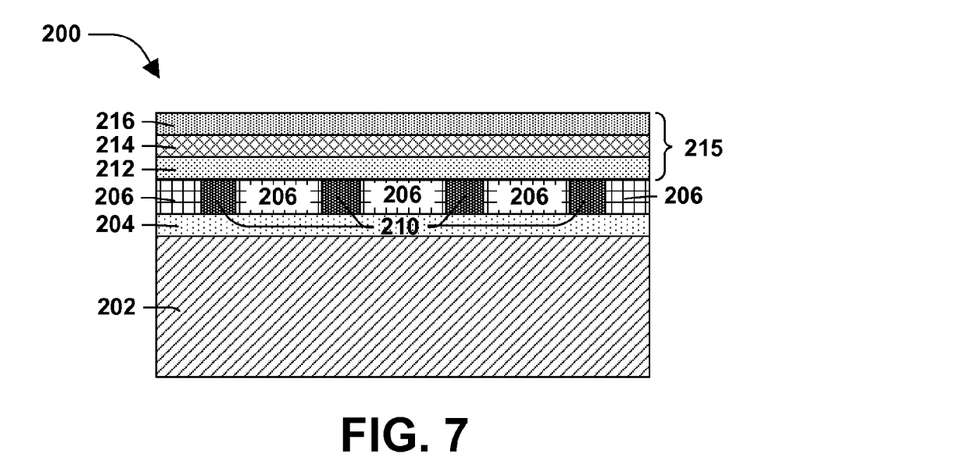
FIG. 7 is an illustration of a semiconductor arrangement at a stage of fabrication, according to some embodiments.
Figure 8:
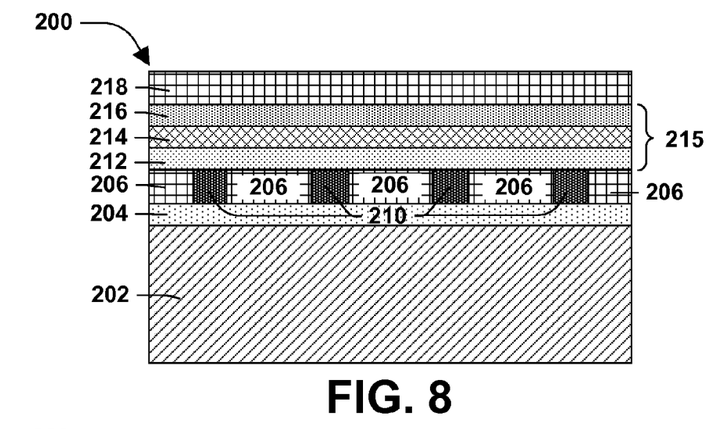
FIG. 8 is an illustration of a semiconductor arrangement at a stage of fabrication, according to some embodiments.
Figure 9:
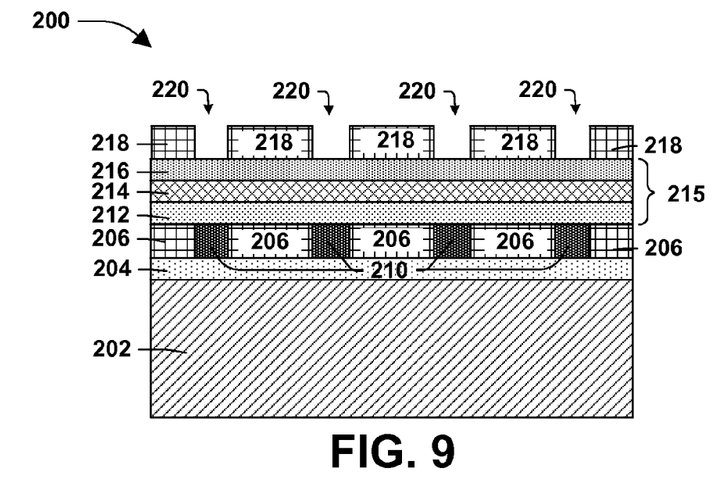
FIG. 9 is an illustration of a semiconductor arrangement at a stage of fabrication, according to some embodiments.
Figure 10:
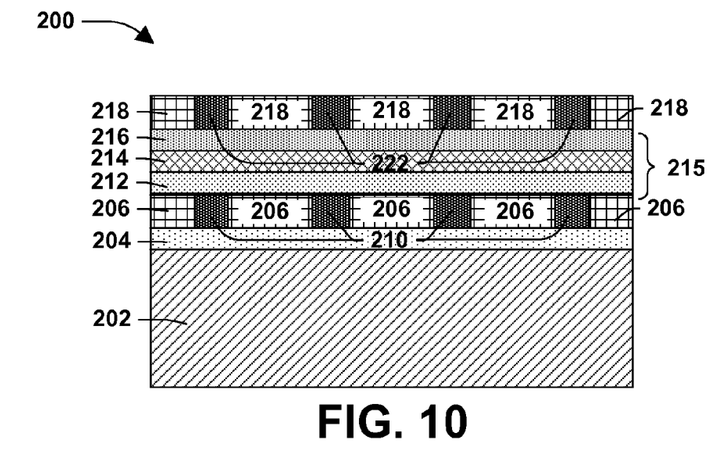
FIG. 10 is an illustration of a semiconductor arrangement at a stage of fabrication, according to some embodiments.

At 102, a first bottom metal 204 is formed, as illustrated in FIG. 2. According to some embodiments, the first bottom metal 204 is formed over a base substrate 202. According to some embodiments, the base substrate 202 comprises at least one of an epitaxial layer, a silicon-on-insulator (SOI) structure, a wafer, or a die formed from a wafer. In some embodiments, the base substrate 202 comprises at least one of silicon, oxide or nitride. In some embodiments, the first bottom metal 204 is formed by deposition. In some embodiments, the first bottom metal 204 is formed by at least one of atomic layer deposition (ALD), chemical vapor deposition (CVD), or physical vapor deposition (PVD). According to some embodiments, the first bottom metal 204 comprises a metal, such as copper. In some embodiments, the first bottom metal 204 has thickness between about 0.05 µm to about 1.0 µm. In some embodiments, a first dielectric layer 206 is formed over the first bottom metal 204. In some embodiments, the first dielectric layer 206 comprises a standard dielectric material with a medium or low dielectric constant, such as $SiO_2$. In some embodiments, the first dielectric layer 206 has thickness between about 0.05 µm to about 2.0 µm. In some embodiments, a first opening 208 is formed in the first dielectric layer 206, such as by etching, where multiple instances of the first opening are illustrated in FIG. 3. In some embodiments, the first opening 208 exposes at least a portion of the first bottom metal 204. In some embodiments, a first bottom via 210 is formed in the first opening 208, such that the first bottom via 210 is in contact with the first bottom metal 204, where multiple instances of the first bottom via are illustrated in FIG. 4. In some embodiments, the first bottom via 210 comprises a conductive material, such as metal. In some embodiments, the first bottom via 210 has a height between about 0.05 µm to about 2.0 µm. Although four instances of the first bottom via 210 are illustrated, any number of instances of the first bottom via 210 is contemplated. Similarly, where a certain number of instances of an element, feature, structure, etc. is illustrated in any of the Figs., any number of instances of the element, feature, structure, etc. are contemplated At 104, a first capacitor 215 is formed over the first bottom metal 204, as illustrate in FIG. 7. Turning to FIG. 5, a first capacitor bottom metal 212 is formed over the first dielectric layer 206 and the first bottom via 210, such that the first capacitor bottom metal 212 is in contact with the first bottom via 210, according to some embodiments. In some embodiments, the first capacitor bottom metal 212 is formed by deposition. In some embodiments, the first capacitor bottom metal 212 is formed by at least one of ALD, CVD or PVD. According to some embodiments, the first capacitor bottom metal 212 comprises a metal, such as copper. In some embodiments, the first capacitor bottom metal 212 has thickness between about 0.05 µm to about 1.0 µm. In some embodiments, a first insulating layer 214 is formed over the first capacitor bottom metal 212, as illustrated in FIG. 6. In some embodiments, the first insulating layer 214 comprises a standard dielectric material with a high, medium or low dielectric constant, such as $SiO_2$. In some embodiments, the first insulating layer 214 has thickness between about 0.06 µm to about 2.0 µm. In some embodiments, a first capacitor top metal 216 is formed over the first insulating layer 214, such that the first capacitor bottom metal 212, the first insulating layer 214 and the first capacitor top metal 216 form the first capacitor 215, as illustrated in FIG. 7. In some embodiments, the first capacitor top metal 216 is formed by deposition. In some embodiments, the first capacitor top metal 216 is formed by at least one of ALD, CVD, or PVD. According to some embodiments, the first capacitor top metal 216 comprises a metal, such as copper. In some embodiments, first capacitor top metal 216 has thickness between about 0.05 µm to about 1.0 µm. In some embodiments, a second dielectric layer 218 is formed over the first capacitor top metal 216, as illustrated in FIG. 8. In some embodiments, the second dielectric layer 218 comprises a standard dielectric material with a medium or low dielectric constant, such as $SiO_2$. In some embodiments, the second dielectric layer 218 has a thickness between about 0.05 µm to about 2.0 µm. In some embodiments, a second opening 220 is formed in the second dielectric layer 218, such as by etching, where multiple instances of the second opening are illustrated in FIG. 9. In some embodiments, the second opening 220 exposes at least a portion of the first capacitor top metal 216. In some embodiments, a first top via 222 is formed in the second opening 220, such that the first top via 222 is in contact with the first capacitor top metal 216, where multiple instances of the first top via are illustrated in FIG. 10. In some embodiments, the first top via 222 comprises a conductive material, such as metal. In some embodiments, the first top via 222 has a height between about 0.05 µm to about 2.0 µm.

Figure 11:
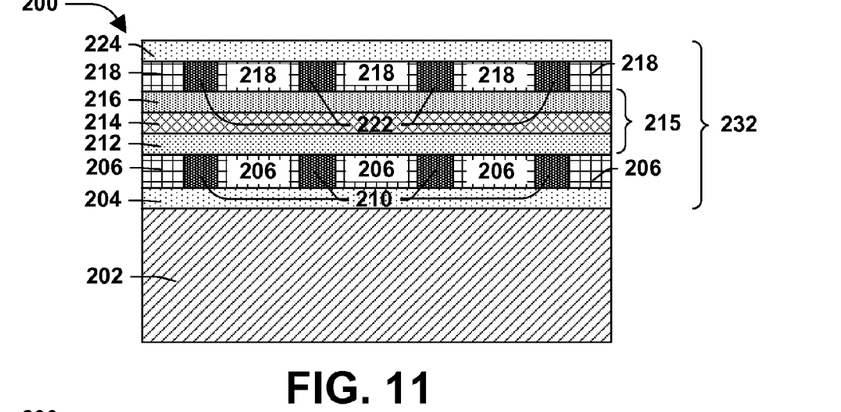
FIG. 11 is an illustration of a semiconductor arrangement at a stage of fabrication, according to some embodiments.

At 106, a first top metal 224 is formed over the first capacitor 215, as illustrated in FIG. 11. In some embodiments, the first top metal 224 is formed over the second dielectric layer 218 and the first top via 222, such that the first top metal 224 is in contact with the first top via 222. According to some embodiments, the first top metal 224 comprises a metal, such as copper. In some embodiments, the first top metal 224 is formed by at least one of ALD, CVD, or PVD. In some embodiments, the first top metal 224 has thickness between about 0.05 µm to about 1.0 µm. According to some embodiments, the first tier 232 comprises the first bottom metal 204, the first dielectric layer 206, the first bottom via 210, the first capacitor 215, the second dielectric layer 218, the first top via 222, and the first top metal 224.

Figure 12:
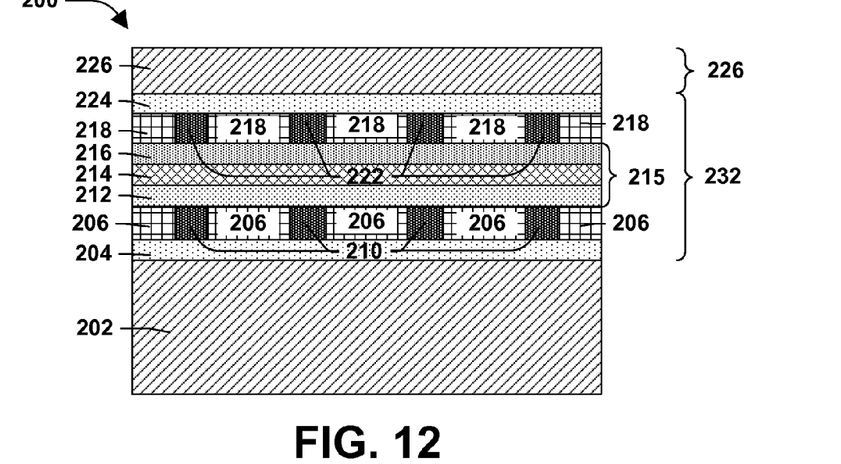
FIG. 12 is an illustration of a semiconductor arrangement at a stage of fabrication, according to some embodiments.
Figure 13:
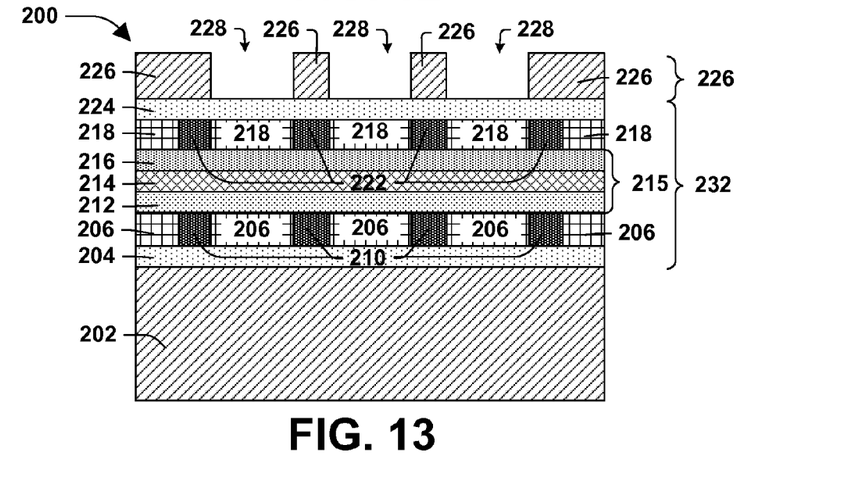
FIG. 13 is an illustration of a semiconductor arrangement at a stage of fabrication, according to some embodiments.
Figure 14:
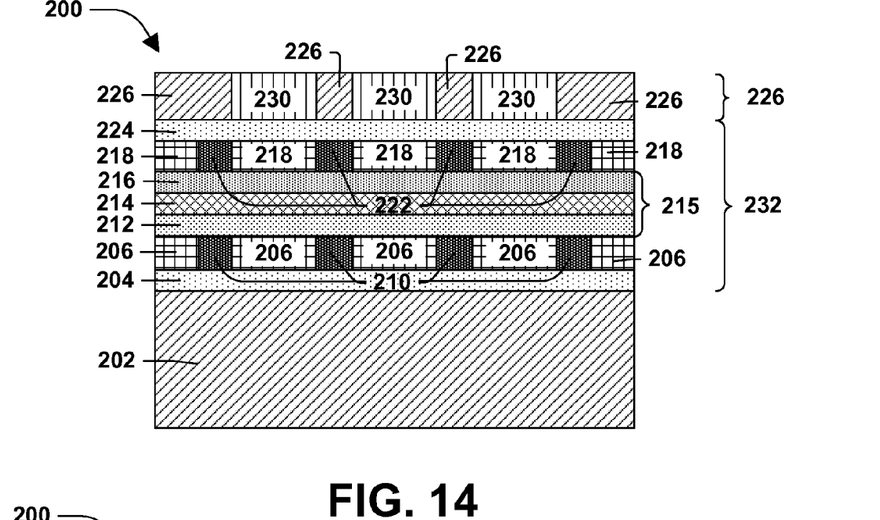
FIG. 14 is an illustration of a semiconductor arrangement at a stage of fabrication, according to some embodiments.

At 108, a first substrate 226 is placed over the first tier 232, as illustrate in FIG. 12. In some embodiments, the first substrate 226 comprises at least one of silicon, oxide or nitride. In some embodiments, the first substrate 226 is at least one of grown or deposited. In some embodiments, the first substrate 226 has a thickness between about 0.05 µm to about 2.0 µm. In some embodiments, a third opening 228 is formed, such as by etching, in the first substrate 226, where multiple instances of the third opening are illustrated in FIG. 13. In some embodiments, the third opening 228 exposes at least a portion of the first top metal 224. In some embodiments, a first interlayer via 230 is formed in the third opening 228, where multiple instances of the first interlayer via are illustrated in FIG. 14. In some embodiments, the first interlayer via 230 is formed in the third opening 228, such that the first interlayer via 230 is in contact with the first top metal 224. In some embodiments, the first interlayer via 230 comprises a conductive material, such as metal. In some embodiments, the first interlayer via 230 has a height between about 0.05 µm to about 2.0 µm. In some embodiments, the first interlayer via 230 has a first interlayer via width greater than a first top via width of the first top via 222.

Figure 15:
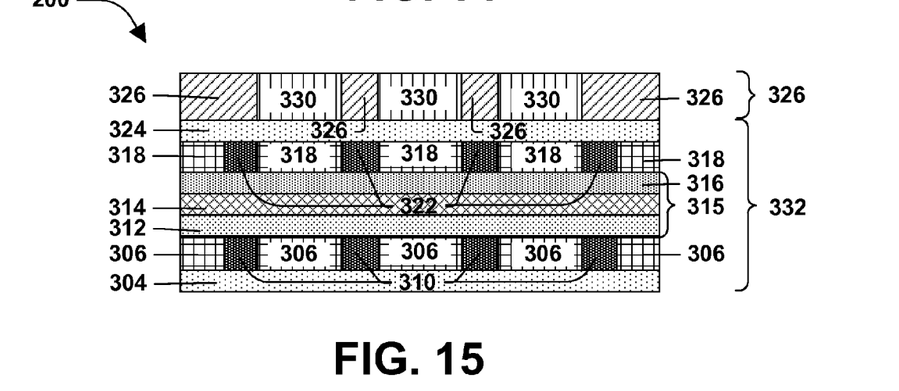
FIG. 15 is an illustration of a semiconductor arrangement at a stage of fabrication, according to some embodiments.

According to some embodiments, a second tier 332 is formed, as illustrated in FIG. 15. According to some embodiments, the second tier 332 comprises a second bottom metal 304, a third dielectric layer 306, a second bottom via 310, the second capacitor 315, a fourth dielectric layer 318, a second top via 322, and a second top metal 324. In some embodiments, the second capacitor 315 comprises a second capacitor bottom metal 312, a second insulating layer 314 and a second capacitor top metal 316, where the second insulating layer 314 is between the second capacitor bottom metal 312 and the second capacitor top metal 316. According to some embodiments, the second tier 332 is formed using substantially the same method 102-106, as the first tier 232.

At 110, according to some embodiments, the second bottom metal 304 is formed, as illustrated in FIG. 15. In some embodiments, the second bottom metal 304 is formed as described above with regards to the first bottom metal 204, such as illustrated in FIG. 2. In some embodiments, the third dielectric layer 306 is formed over the second bottom metal 304. In some embodiments, the third dielectric layer 306 is formed as described above with regards to the first dielectric layer 206, such as illustrated in FIG. 2. In some embodiments, a fourth opening is formed in third dielectric layer 306. In some embodiments, the fourth opening is formed as described above with regards to the first opening 208, such as illustrated in FIG. 3. In some embodiments, the second bottom via 310 is formed in the fourth opening. In some embodiments, the second bottom via 310 is formed as described above with regards to the first bottom via 210, such as illustrated in FIG. 4.

At 112, the second capacitor 315 is formed over the third dielectric layer 306 and the second bottom via 310, as illustrated in FIG. 15. In some embodiments, the second capacitor 315 is formed as described above with regards to the first capacitor 215, such as illustrated in FIGS. 5-7. In some embodiments, the fourth dielectric layer 318 is formed over the second capacitor 315. In some embodiments, the fourth dielectric layer 318 is formed as described above with regards to the second dielectric layer 218, such as illustrated in FIG. 8. In some embodiments, a fifth opening is formed in the fourth dielectric layer 318. In some embodiments, the fifth opening is formed as described above with regards to the second opening 220, such as illustrated in FIG. 9. In some embodiments, the second top via 322 is formed in the fifth opening. In some embodiments, the second top via 322 is formed as described above with regards to the first top via 222, such as illustrated in FIG. 10.

At 114, the second top metal 324 is formed over the fourth dielectric layer 318 and the second top via 322, as illustrated in FIG. 15. In some embodiments, the second top metal 324 is formed as described above with regards to the first top metal 224, such as illustrated in FIG. 11.

At 116, the second substrate 326 is placed over the second top metal 324 of the second tier 332, as illustrated in FIG. 15. In some embodiments, the second substrate 326 is formed as described above with regards to the first substrate 226, such as illustrated in FIG. 12. In some embodiments, a sixth opening is formed in the second substrate 326. In some embodiments, the sixth opening is formed as described above with regards to the third opening 228, such as illustrated in FIG. 13. In some embodiments, a second interlayer via 330 is formed in the sixth opening, as illustrated in FIG. 15. In some embodiments, the second interlayer via 330 is formed as described above with regards to the first interlayer via 230, such as illustrated in FIG. 14.

At 118, the second tier 332 and the second substrate 326 are stacked on top of the first substrate 226 over the first tier 232, such that the first substrate 226 over the first tier 232 is in contact with the second bottom metal 304 of the second tier 332, as illustrated in FIG. 17. According to some embodiments, multiple tiers with multiple substrates between the multiple tiers are contemplated.

Figure 16:
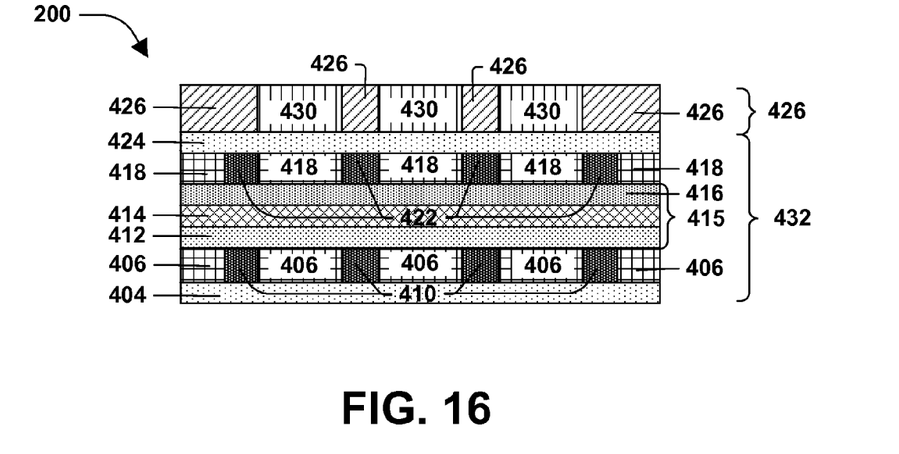
FIG. 16 is an illustration of a semiconductor arrangement at a stage of fabrication, according to some embodiments.
Figure 17:
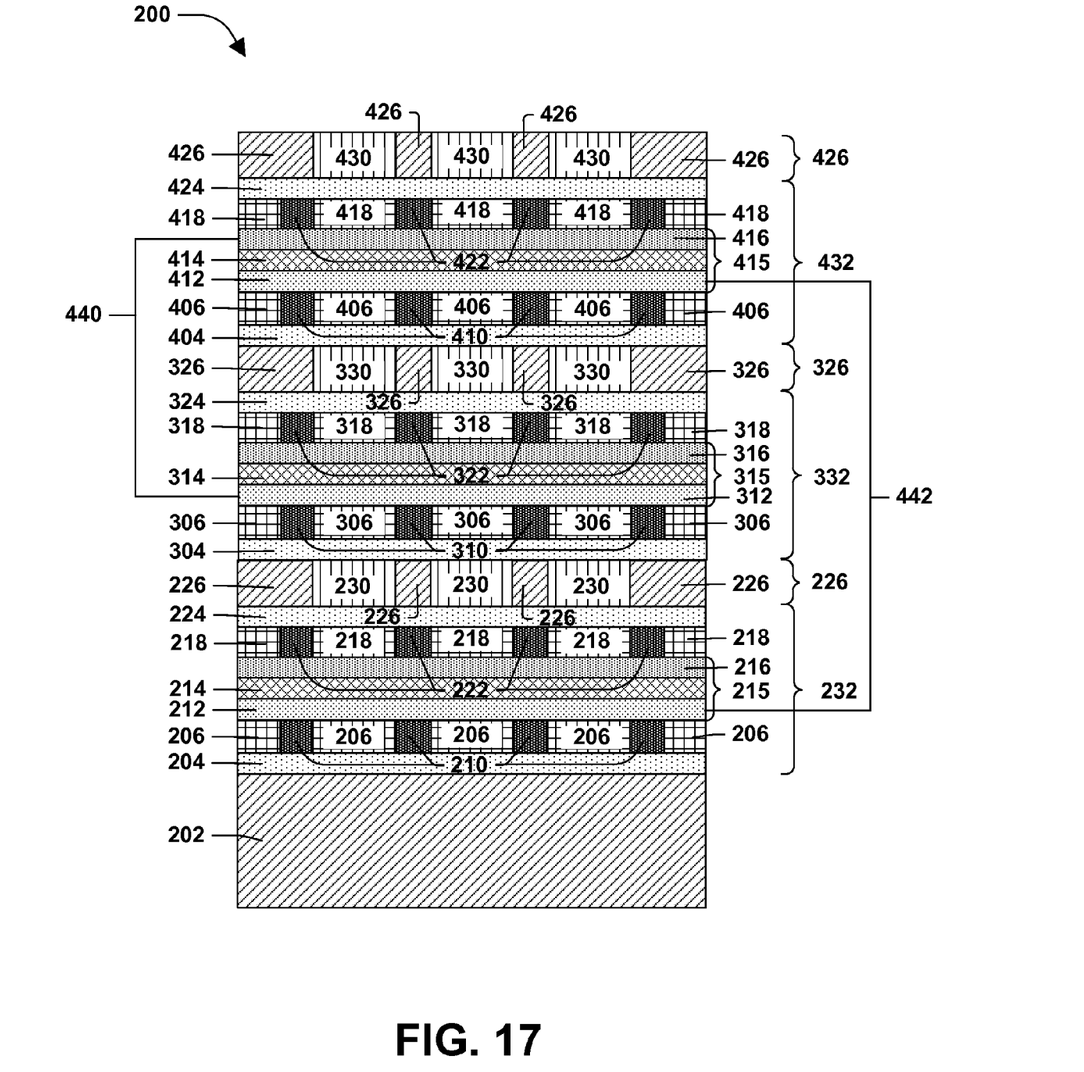
FIG. 17 is an illustration of a semiconductor arrangement at a stage of fabrication, according to some embodiments.

At 120, according to some embodiments, the third bottom metal 404 is formed, as illustrated in FIG. 16. In some embodiments, the third bottom metal 404 is formed as described above with regards to the first bottom metal 204, such as illustrated in FIG. 2. In some embodiments, the fifth dielectric layer 406 is formed over the third bottom metal 404. In some embodiments, the fifth dielectric layer 406 is formed as described above with regards to the first dielectric layer 206, such as illustrated in FIG. 2. In some embodiments, a seventh opening is formed in fifth dielectric layer 406. In some embodiments, the seventh opening is formed as described above with regards to the first opening 208, such as illustrated in FIG. 3. In some embodiments, the third bottom via 410 is formed in the seventh opening. In some embodiments, the third bottom via 410 is formed as described above with regards to the first bottom via 210, such as illustrated in FIG. 4.

At 122, the third capacitor 415 is formed over the fifth dielectric layer 406 and the third bottom via 410, as illustrated in FIG. 16. In some embodiments, the third capacitor 415 is formed as described above with regards to the first capacitor 215, such as illustrated in FIGS. 5-7. In some embodiments, a sixth dielectric layer 418 is formed over the third capacitor 415. In some embodiments, the sixth dielectric layer 418 is formed as described above with regards to the second dielectric layer 218, such as illustrated in FIG. 8. In some embodiments, an eighth opening is formed in the sixth dielectric layer 418. In some embodiments, the eighth opening is formed as described above with regards to the second opening 220, such as illustrated in FIG. 9. In some embodiments, a third top via 422 is formed in the eighth opening. In some embodiments, the third top via 422 is formed as described above with regards to the first top via 222, such as illustrated in FIG. 10.

At 124, a third top metal 424 is formed over the sixth dielectric layer 418 and the third top via 422, as illustrated in FIG. 16. In some embodiments, the third top metal 424 is formed as described above with regards to the first top metal 224, such as illustrated in FIG. 11.

At 126, a third substrate 426 is placed over the third top metal 424 of the third tier 432, as illustrated in FIG. 16. In some embodiments, the third substrate 426 is formed as described above with regards to the first substrate 226, such as illustrated in FIG. 12. In some embodiments, a ninth opening is formed in the third substrate 426. In some embodiments, the ninth opening is formed as described above with regards to the third opening 228, such as illustrated in FIG. 13. In some embodiments, a third interlayer via 430 is formed in the ninth opening. In some embodiments, the third interlayer via 430 is formed as described above with regards to the first interlayer via 230, such as illustrated in FIG. 14.

At 128, the third tier 432 and the third substrate 426 are stacked on top of the second substrate 326 over the second tier 332, such that the second substrate 326 over the second tier 332 is in contact with the third bottom metal 404 of the third tier 432, as illustrated in FIG. 17. According to some embodiments, multiple tiers with multiple substrates between the multiple tiers are contemplated. For example, a fourth tier and a fourth substrate, which comprise substantially the same structure and material as the second tier 332 and the second substrate 326, are stacked on the third substrate 426 in substantially the same manner as the second tier 332 is stacked on the first substrate 226.

At 130, a power input 440 is connected to the second capacitor bottom metal 312 and the third capacitor top metal 416 and a power output 442 is connected to the first capacitor bottom metal 212 and the third capacitor bottom metal 412. According to some embodiments, interconnecting metal layers to one another increases the effective area of capacitive plates and thus increases the overall capacitance of the arrangement, or one or more capacitors therein.

According to some embodiments, a semiconductor arrangement comprises a first tier comprising a first capacitor and a second tier comprising a second capacitor, the second tier over the first tier. In some embodiments, a first substrate is between the first tier and the second tier. In some embodiments, the first capacitor is connected to the second capacitor through the first substrate. In some embodiments, a second substrate is over the second tier and a third tier is over the second substrate. In some embodiments, the third tier comprises a third capacitor, the third capacitor connected to the second capacitor through the second substrate. In some embodiments, a power input is connected to a second capacitor bottom metal of the second capacitor and a third capacitor top metal of the third capacitor. In some embodiments, a power output is connected to a first capacitor bottom metal of the first capacitor and a third capacitor bottom metal of the third capacitor.

According to some embodiments, a method of forming a semiconductor arrangement comprises forming a first capacitor in a first tier, placing a first substrate over the first tier and forming a second capacitor in a second tier, such that the second tier is over the first substrate. According to some embodiments, the method comprises forming a connection from the first capacitor to the second capacitor through the first substrate, forming a second substrate over the second tier and forming a third capacitor in a third tier, such that the third tier is over the second substrate. According to some embodiments, the method comprises forming a connection from the second capacitor to the third capacitor through the second substrate. According to some embodiments, the method comprises connecting a power input to a second capacitor bottom metal of the second capacitor and a third capacitor top metal of the third capacitor, and connecting a power output to a first capacitor bottom metal of the first capacitor and a third capacitor bottom metal of the third capacitor.

According to some embodiments, a semiconductor arrangement comprises a first tier comprising a first capacitor. In some embodiments, the first capacitor comprises a first capacitor bottom metal, a first insulating layer and a first capacitor top metal, where the first insulating layer is between the first capacitor bottom metal and the first capacitor top metal. In some embodiments, the semiconductor arrangement comprises a second tier over the first tier and the second tier comprises a second capacitor. In some embodiments, the second capacitor comprises a second capacitor bottom metal, a second insulating layer and a second capacitor top metal, where the second insulating layer is between the second capacitor bottom metal and the second capacitor top metal. In some embodiments, the semiconductor arrangement comprises a first substrate between the first tier and the second tier. In some embodiments, a third tier is over the second tier, the third tier comprising a third capacitor. In some embodiments, the third capacitor comprises a third capacitor bottom metal, a third insulating layer, and a third capacitor top metal, where the third insulating layer is between the third capacitor bottom metal and the third capacitor top metal. In some embodiments, a second substrate is between the second tier and the third tier, where a power input is connected to the second capacitor bottom metal and the third capacitor top metal, and a power output is connected to the first capacitor bottom metal and the third capacitor bottom metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
    a first tier comprising a first capacitor;
    a second tier comprising a second capacitor, the second tier over the first tier;
    a first substrate between the first tier and the second tier, the first capacitor connected to the second capacitor through the first substrate;
    a second substrate over the second tier; and
    a third tier over the second substrate, the third tier comprising a third capacitor, the third capacitor connected to the second capacitor through the second substrate,
        a power input connected to a second capacitor bottom metal of the second capacitor and a third capacitor top metal of the third capacitor, and
        a power output connected to a first capacitor bottom metal of the first capacitor and a third capacitor bottom metal of the third capacitor.

2. The semiconductor arrangement of claim 1, the first capacitor comprising:
    the first capacitor bottom metal;
    a first insulating layer; and
    a first capacitor top metal, the first insulating layer between the first capacitor bottom metal and the first capacitor top metal.

3. The semiconductor arrangement of claim 1, the second capacitor comprising:
    the second capacitor bottom metal;
    a second insulating layer; and
    a second capacitor top metal, the second insulating layer between the second capacitor bottom metal and the second capacitor top metal.

4. The semiconductor arrangement of claim 1, the third capacitor comprising:
    the third capacitor bottom metal;
    a third insulating layer; and
    the third capacitor top metal, the third insulating layer between the third capacitor bottom metal and the third capacitor top metal.

5. The semiconductor arrangement of claim 1, the first tier comprising:
    a first bottom metal; and
    a first top metal, the first capacitor over the first bottom metal and the first top metal over the first capacitor.

6. The semiconductor arrangement of claim 1, the second tier comprising:
    a second bottom metal; and
    a second top metal, the second capacitor over the second bottom metal and the second top metal over the second capacitor.

7. The semiconductor arrangement of claim 1, the third tier comprising:
    a third bottom metal; and
    a third top metal, the third capacitor over the third bottom metal and the third top metal over the third capacitor.

8. The semiconductor arrangement of claim 1, the first capacitor connected to the second capacitor through the first substrate by a connection, the connection comprising:
    a first top via connected to a first capacitor top metal and a first top metal;
    the first top metal connected to a first interlayer via located in the first substrate;
    the first interlayer via connected to a second bottom metal;
    the second bottom metal connected to a second bottom via; and
    the second bottom via connected to the second capacitor bottom metal.

9. The semiconductor arrangement of claim 1, the second capacitor connected to the third capacitor through the second substrate by a connection, the connection comprising:
    a second top via connected to a second capacitor top metal and a second top metal;
    the second top metal connected to a second interlayer via located in the second substrate;
    the second interlayer via connected to a third bottom metal;
    the third bottom metal connected to a third bottom via; and
    the third bottom via connected to the third capacitor bottom metal.

10. A method of forming a semiconductor arrangement comprising:
    forming a first capacitor in a first tier;
    placing a first substrate over the first tier;
    forming a second capacitor in a second tier, such that the second tier is over the first substrate;
    forming a connection from the first capacitor to the second capacitor through the first substrate;
    forming a second substrate over the second tier;
    forming a third capacitor in a third tier, such that the third tier is over the second substrate;
    forming a connection from the second capacitor to the third capacitor through the second substrate;
    connecting a power input to a second capacitor bottom metal of the second capacitor and a third capacitor top metal of the third capacitor, and
    connecting a power output to a first capacitor bottom metal of the first capacitor and a third capacitor bottom metal of the third capacitor.

11. The method of claim 10, the forming a first capacitor comprising:

forming the first capacitor bottom metal;
   forming a first insulating layer over the first capacitor bottom metal; and
   forming a first capacitor top metal over the first insulating layer.

12. The method of claim 11, the forming a second capacitor comprising:
   forming the second capacitor bottom metal;
   forming a second insulating layer over the second capacitor bottom metal; and
   forming a second capacitor top metal over that the second insulating layer.

13. The method of claim 12, the forming a third capacitor comprising:
   forming the third capacitor bottom metal;
   forming a third insulating layer over the third capacitor bottom metal; and
   forming the third capacitor top metal over that the third insulating layer.

14. The method of claim 13, comprising:
   forming a first bottom metal in the first tier under the first capacitor;
   forming a first top metal in the first tier over the first capacitor;
   forming a second bottom metal in the second tier under the second capacitor;
   forming a second top metal in the second tier over the second capacitor;
   forming a third bottom metal in the third tier under the third capacitor; and
   forming a third top metal in the third tier over the third capacitor.

15. The method of claim 14, the forming a connection from the first capacitor to the second capacitor comprising:
   forming a first top via in a second dielectric layer to connect the first capacitor top metal to the first top metal;
   forming a first interlayer via in the first substrate to connect the first top metal to the second bottom metal; and
   forming a second bottom via in a third dielectric layer to connect the second bottom metal to the second capacitor bottom metal.

16. The method of claim 14, the forming a connection from the second capacitor to the third capacitor comprising:
   forming a second top via in a fourth dielectric layer to connect the second capacitor top metal to the second top metal;
   forming a second interlayer via in the second substrate to connect the second top metal to the third bottom metal; and
   forming a third bottom via in a fifth dielectric layer to connect the second bottom metal to the second capacitor bottom metal.

17. A semiconductor arrangement comprising:
   a first tier comprising a first capacitor, the first capacitor comprising:
      a first capacitor bottom metal;
      a first insulating layer; and
      a first capacitor top metal, where the first insulating layer is between the first capacitor bottom metal and the first capacitor top metal;
   a second tier over the first tier, the second tier comprising a second capacitor, the second capacitor comprising:
      a second capacitor bottom metal;
      a second insulating layer; and
      a second capacitor top metal, where the second insulating layer is between the second capacitor bottom metal and the second capacitor top metal;
   a first substrate between the first tier and the second tier;
   a third tier over the second tier, the third tier comprising a third capacitor, the third capacitor comprising:
      a third capacitor bottom metal;
      a third insulating layer; and
      a third capacitor top metal, where the third insulating layer is between the third capacitor bottom metal and the third capacitor top metal; and
   a second substrate between the second tier and the third tier, where a power input is connected to the second capacitor bottom metal and the third capacitor top metal, and a power output is connected to the first capacitor bottom metal and the third capacitor bottom metal.

18. The semiconductor arrangement of claim 17, comprising:
   a first bottom metal and a first top metal in the first tier, the first capacitor over the first bottom metal and the first top metal over the first capacitor;
   a second bottom metal and a second top metal in the second tier, the second capacitor over the second bottom metal and the second top metal over the second capacitor; and
   a third bottom metal and a third top metal in the third tier, the third capacitor over the third bottom metal and the third top metal over the third capacitor.

19. The semiconductor arrangement of claim 18, the first capacitor connected to the second capacitor through the first substrate by a connection, the connection comprising:
   a first top via connected to the first capacitor top metal and the first top metal;
   the first top metal connected to a first interlayer via located in the first substrate;
   the first interlayer via connected to the second bottom metal;
   the second bottom metal connected to a second bottom via; and
   the second bottom via connected to the second capacitor bottom metal.

20. The semiconductor arrangement of claim 18, the second capacitor connected to the third capacitor through the second substrate by a connection, the connection comprising:
   a second top via connected to the second capacitor top metal and the second top metal;
   the second top metal connected to a second interlayer via located in the second substrate;
   the second interlayer via connected to the third bottom metal;
   the third bottom metal connected to a third bottom via; and
   the third bottom via connected to the third capacitor bottom metal.

* * * * *